(12) United States Patent
Majumdar et al.

(10) Patent No.: US 8,865,298 B2
(45) Date of Patent: *Oct. 21, 2014

(54) ARTICLE WITH METAL GRID COMPOSITE AND METHODS OF PREPARING

(75) Inventors: Debasis Majumdar, Rochester, NY (US); Roger Lee Klaus, Victor, NY (US); Michael J. Corrigan, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 520 days.

This patent is subject to a terminal disclaimer.

(21) Appl. No.: 13/171,895

(22) Filed: Jun. 29, 2011

(65) Prior Publication Data

US 2013/0004753 A1 Jan. 3, 2013

(51) Int. Cl.
| | |
|---|---|
| *B32B 7/06* | (2006.01) |
| *H01L 21/50* | (2006.01) |
| *H01L 51/00* | (2006.01) |
| *H01L 51/10* | (2006.01) |
| *H01L 51/44* | (2006.01) |
| *H01L 51/52* | (2006.01) |

(52) U.S. Cl.
CPC ........... *H01L 51/0024* (2013.01); *H01L 51/445* (2013.01); *H01L 51/102* (2013.01); *H01L 51/003* (2013.01); *H01L 51/5212* (2013.01); *H01L 51/5228* (2013.01)
USPC ........... 428/209; 428/202; 428/336; 428/343; 428/344; 428/352; 428/355 RA; 438/106

(58) Field of Classification Search
USPC .......... 428/202, 209, 336, 343, 344, 355 RA; 438/106
See application file for complete search history.

(56) References Cited

U.S. PATENT DOCUMENTS

| | | | | |
|---|---|---|---|---|
| 5,293,546 | A | * | 3/1994 | Tadros et al. ................. 359/269 |
| 5,561,030 | A | | 10/1996 | Holdcroft et al. |
| 5,738,934 | A | | 4/1998 | Jones |
| 7,401,758 | B2 | * | 7/2008 | Liang et al. ................... 249/112 |
| 7,410,825 | B2 | | 8/2008 | Majumdar et al. |

(Continued)

FOREIGN PATENT DOCUMENTS

WO 97/18944 5/1997

OTHER PUBLICATIONS

Jingyu Zou et al., "Metal grid/conducting polymer hybrid transparent electrode for inverted polymer solar cells", *Applied Physics Letters* 96, 203301 (2010).

(Continued)

*Primary Examiner* — Cathy Lam
(74) *Attorney, Agent, or Firm* — J. Lanny Tucker

(57) ABSTRACT

A laminate donor element can be used to transfer a composite of a metal grid and an electronically conductive polymer to a receiver sheet for use in various devices. The laminate donor element has a donor substrate, a metal grid that is disposed over only portions of the donor substrate, leaving portions of the substrate uncovered by the metal grid, and an electronically conductive polymer that covers the portions of the donor substrate that are uncovered by the metal grid. The composite of metal grid and electronically conductive polymer exhibits a peel force of less than or equal to 40 g/cm for separation from the donor substrate at room temperature. The resulting article has a substrate on which a reverse composite of the metal grid and electronically conductive polymer is disposed, which article can be incorporated into various devices.

14 Claims, 5 Drawing Sheets

(56) References Cited

U.S. PATENT DOCUMENTS

| | | |
|---|---|---|
| 7,414,313 B2 | 8/2008 | Majumdar et al. |
| 7,710,018 B2 | 5/2010 | Uhlig et al. |
| 7,781,047 B2 | 8/2010 | Majumdar et al. |
| 2001/0018851 A1 | 9/2001 | Horine |
| 2003/0008135 A1 | 1/2003 | Kawamura et al. |
| 2003/0230337 A1 | 12/2003 | Gaudiana et al. |
| 2007/0079869 A1 | 4/2007 | Yukinobu |
| 2008/0023066 A1 | 1/2008 | Hecht et al. |
| 2010/0118243 A1 | 5/2010 | Majumdar et al. |
| 2010/0300529 A1 | 12/2010 | Kawahara et al. |

OTHER PUBLICATIONS

U.S. Appl. No. 13/171,852, filed Jun. 29, 2011, entitled "Electronically Conductive Laminate Donor Element" by Majumdar et al.

* cited by examiner

_US 8,865,298 B2_

ARTICLE WITH METAL GRID COMPOSITE AND METHODS OF PREPARING

RELATED APPLICATION

Reference is made to U.S. Ser. No. 13/171,852 filed on even date herewith by Majumdar, Klaus, and Corrigan, and entitled "Electronically Conductive Laminate Donor Element".

FIELD OF THE INVENTION

This invention relates to a method using a laminate donor element to transfer a metal grid and electronically conductive polymer to a receiver sheet. This invention also relates to the resulting electronically conductive assemblies and articles.

BACKGROUND OF THE INVENTION

Transparent electrically-conductive layers (TCL) of metal oxides such as indium tin oxide, antimony doped tin oxide, and cadmium stannate (cadmium tin oxide) are commonly used in the manufacture of electrooptical display devices such as liquid crystal display devices (LCD's), electroluminescent display devices, photocells (solar cells), solid-state image sensors, and electrochromic windows. Devices such as flat panel displays have contained a substrate provided with an indium tin oxide layer as a transparent electrode. Such articles can be expensive to make due to the high cost of fabrication. As a result, there has been a strong interest in recent years in making all organic devices comprising plastic resins as flexible substrates and organic electroconductive polymer layers as electrodes. The advantages for such organic devices are significant and they have become the object of considerable research and development efforts worldwide.

Electronically conductive polymers have received considerable attention for the last twenty years in various industries because of their electronic conductivity. Although many of these polymers are colored and less suited for TCL applications, some of the electronically conductive polymers are sufficiently transparent, at least when coated in thin layers on transparent substrates. Descriptions of such electronically conductive polymers are provided, for example relating to substituted and unsubstituted pyrrole-containing polymers in U.S. Pat. No. 5,665,498 (Savage et al.) and U.S. Pat. No. 5,674,654 (Zumbalyadis et al.), relating to substituted or unsubstituted thiophene-containing polymers in U.S. Pat. No. 4,987,042 (Jonas et al.), U.S. Pat. No. 4,731,408 (Jasne), U.S. Pat. No. 5,300,575 (Jonas et al.), U.S. Pat. No. 5,312,681 (Muys et al.), U.S. Pat. No. 5,354,613 (Quinters et al.), U.S. Pat. No. 5,370,981 (Krafft et al.), U.S. Pat. No. 5,372,924 (Quinters et al.), U.S. Pat. No. 5,391,472 (Muys et al.), U.S. Pat. No. 5,403,467 (Jonas et al.), and U.S. Pat. No. 5,443,944 (Azoulay), and EP 440,957A (Jonas et al.) and EP 686,662A (Jonas), and relating to substituted or unsubstituted aniline-containing polymers in U.S. Pat. No. 4,070,189 (Kelley et al.), U.S. Pat. No. 5,093,439 (Epstein et al.), and U.S. Pat. No. 5,716,550 (Gardner et al.).

Many electronic and optical devices are formed using layers of different materials that are stacked on each other. These layers can be patterned to produce the devices. Examples of such devices include optical displays in which each pixel is formed in a patterned array, optical waveguide structures for telecommunications devices, and metal-insulator-metal stacks for semiconductor-based devices. One method for making such devices includes forming one or more layers on a receiver sheet and patterning the layers simultaneously or sequentially to form a device. These methods generally require multiple deposition and patterning steps and can be quite tedious and costly in materials and manufacture. Patterning of such layers is often carried out using photolithographic techniques that can include covering a layer with a photoresist, patterning the photoresist using a mask, removing a portion of the photoresist to expose the underlying layer according to the pattern, and then etching the exposed layer.

The use of wet-etching microlithography to pattern electronically conductive polymers is described for example in WO 97/18944 (Calvert et al.). A similar method is described in U.S. Pat. No. 5,561,030 (Holdcroft et al.) in which a non-conductive prepolymer is patterned and after washing away the mask, the prepolymers is rendered conductive by oxidation. Such methods that use lithographic techniques are cumbersome as they involve many steps and require the use of hazardous chemicals.

The application of electronically conductive polymers in display related devices has been suggested for example in U.S. Pat. No. 5,738,934 (Jones) where the polymers are used as touch screen cover sheets. Electronically conductive polymers are also described for use in liquid crystal display devices but the transparency can be too low.

The use of in-situ polymerized polythiophene and polypyrrole has been proposed in U.S. Patent Application Publication 2003/008135 (Kawamura et al.) as conductive films, for replacement of indium tin oxide. However, such processes are difficult to implement for roll-to-roll production of conductive coatings.

U.S. Pat. No. 7,781,047 (Majumdar et al.) and U.S. Pat. No. 7,414,313 (Majumdar et al.) describe donor elements useful for transfer of electronically conductive polymers to suitable receiver sheets that can be then used as components in various devices. Polymer transfer is accomplished by the application or heat, pressure, or both and can be in the form of a pattern. Although quite effective for transfer, the conductivity of the transferred layer is limited by that of the electronically conductive polymer, which is often less than metals such as gold or silver. This limited conductivity can reduce the number of uses since many uses require much higher conductivity.

U.S. Pat. No. 7,410,825 (Majumdar et al.) describes a donor laminate that can be used to transfer multiple layers including electronically conductive polymers and a metal to a receiver sheet. The donor laminate includes a substrate and in order, an electronically conductive polymer and a metal layer. After transfer, the receiver sheet then comprises the transferred materials in reverse order. That is, the metal layer is next to the receiver sheet support and the electronically conductive polymer is disposed over the metal layer.

While these donor laminates and transfer method represent an advance in the art because they provide greater conductivity in the resulting articles, the transferred metal layer over the transferred electronically conductive layer can have insufficient transparency. Moreover, the metal layer or grid that is buried under an electronically conductive polymer after transfer may not be as effective an electrical conductor as an exposed metal layer or grid. These problems limit the number of uses of the articles with the transferred layers.

SUMMARY OF THE INVENTION

The present invention provides an article comprising an article substrate having thereon, in order, an adhesive layer and a reverse composite comprising an electronically conductive polymer layer and a metal grid such that the metal grid is disposed over the adhesive layer and the voids of the metal grid are filled by the electronically conductive polymer, and at least some of the metal grid is uncovered.

Some embodiments of these articles comprise a receiver sheet comprising a receiver substrate, having thereon, in order, an adhesive layer and the reverse composite disposed over the adhesive layer such that the voids of the metal grid are filled by the electronically conductive polymer, and at least some of the metal grid is uncovered.

In addition, this invention provides an article comprising an article substrate having thereon a continuous electronically conductive polymer and a metal grid disposed within the outer surface of the continuous electronically conductive polymer layer such that the voids of the metal grid are filled by the continuous electronically conductive polymer, and wherein the electronically conductive polymer is also disposed between the article substrate and the metal grid.

This invention also includes a method of forming an article comprising a metal grid, the method comprising:

under heat, pressure, or both heat and pressure, forming an assembly of a laminate donor element and a receiver sheet, the laminate donor element comprising, in order:
a donor substrate,
a metal grid comprising two or more metal lines that are in direct contact with only portions of the donor substrate, leaving portions of the donor substrate uncovered by the metal grid, and
an electronically conductive polymer layer that directly covers the portions of the donor substrate uncovered by the metal grid, and optionally directly covers at least some of the metal grid, thereby forming a composite of metal grid and electronically conductive polymer, and transferring the composite of metal grid and electronically conductive polymer from the donor substrate to the receiver sheet so that the receiver sheet has thereon a reverse composite comprising the continuous electronically conductive polymer layer and the metal grid such that the metal grid is disposed on the receiver sheet and the voids of the metal grid are filled by the electronically conductive polymer, and at least some of the metal grid is uncovered.

This invention also provides an assembly comprising a laminate donor element in intimate contact with a receiver sheet comprising a receiver substrate, the laminate donor element comprising, in order:
a donor substrate,
a metal grid comprising two or more metal lines that are in direct contact with only portions of the donor substrate, leaving portions of the donor substrate uncovered by the metal grid, and
an electronically conductive polymer layer that directly covers the portions of the donor substrate uncovered by the metal grid, and optionally directly covers at least some of the metal grid, thereby forming a composite of metal grid and electronically conductive polymer.

In some of the desired assemblies of this invention, the electronically conductive polymer layer comprises a substituted or unsubstituted thiophene-containing polymer, and the metal grid consists essentially of a plurality of silver lines, wherein the metal grid covers at least 0.01% and up to and including 90% of the donor substrate surface area, each silver line of the metal grid has an average width of at least 0.01 µm and up to and including 500 µm and an average height of at least 0.01 µm and up to and including 10 µm, the electronically conductive polymer has an average thickness of at least 0.01 µm and up to and including 10 µm, and the composite of the metal grid and electronically conductive polymer exhibits a peel force of less than 40 g/cm for separation from the donor substrate at room temperature.

The present invention can provide transferred metal grids and electronically conductive polymer onto receiver sheets or other article substrates in a predetermined or random pattern, optionally over an adhesive on the receiver sheet, with improved planarity (surface topography) and more uniform conductivity because of improved contact with layers. The present invention provides the resulting assembly of laminate donor element and receiver sheet used in the transfer, the articles resulting from the transfer, and methods for transfer.

The laminate donor element used in this invention to transfer a conductive composite that is highly and continuously conductive and highly transparent. The invention also provides a method and an assembly to transfer the conductive composite from one substrate to another to form a different article that can be used for many purposes defined below. Furthermore, the invention provides a receiver article comprising the conductive composite, and this receiver article can be incorporated into an electronic or optical device as described below.

DETAILED DESCRIPTION OF THE INVENTION

Figure 1:
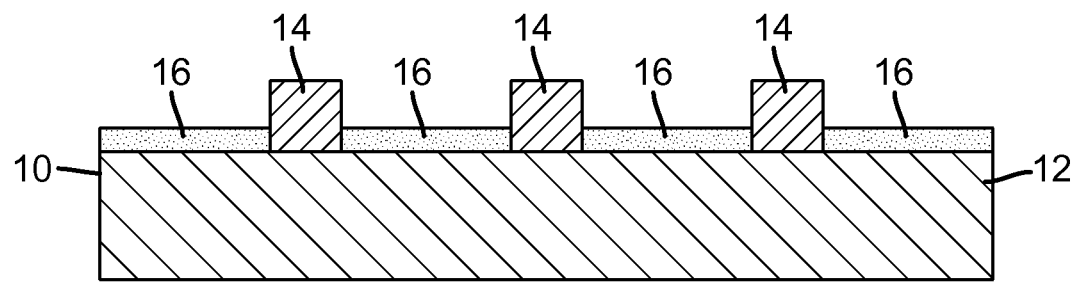
FIGS. 1, 2, 3a, 3b, 4, 5, and 6 are cross-sectional views of several embodiments of laminate donor elements of this invention.

The laminate donor elements described herein can be used in a transfer method to form metal grids and improved conductive layers, especially those comprising electronically conductive polymers, on receiver sheets or other article substrates. Such receiver sheets can be incorporated into various electronic or optical devices.

More particularly, the laminate donor element is useful for transfer of an electronically conductive polymer, which laminate donor element comprises a donor substrate having thereon a metal grid comprising a plurality (two or more) metal lines that are disposed over only portions of the substrate, leaving portions of the substrate uncovered by the metal grid. The metal grid lines can also be in direct contact with the donor substrate. The laminate donor element also comprises an electronically conductive polymer that directly covers the portions of the substrate uncovered by the metal grid. These metal grid and electronically conductive polymer are the two essential components that form a composite of metal grid and electronically conductive polymer layer.

The electronically conductive layer can optionally and directly cover at least some of the metal grid. For example, in some embodiments, the electronically conductive polymer at least partially covers the metal grid. For example, the electronically conductive polymer can completely cover some of the metal grid lines, or partially cover some of the metal grid lines, or both completely cover some of the metal grid lines and partially cover some of the other metal grid lines. The coverage does not need to be the same for each metal line. In some embodiments, the electronically conductive layer covers minimal surface area (less than 20%) of the metal grid. In other embodiments, the electronically conductive layer covers essentially all (at least 90%) of the surface area of the metal grid.

A method of this invention can be used to transfer the composite of metal grid and electronically conductive polymer to a receiver sheet to form a device. Either complete or partial transfer can be achieved to form suitable devices and other objects using various transfer mechanisms and laminate donor element configurations.

For example, the laminate donor elements can be used to form, for example, electronic circuitry, resistors, capacitors, electrodes, charge injection layers, diodes, rectifiers, electroluminescent lamps, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (for example, add-drop filters, gain-flattening filters, and cut-off filters), mirrors, splitters, couplers, combiners, modulators, sensors (for example, evanescent sensors, phase modulation sensors, and interferometric sensors), optical cavities, piezoelectric devices, ferroelectric devices, thin film batteries, radio frequency identification (RFID) tags, electromagnetic interference (EMI) shields, printed circuit boards (PCB), or combinations thereof. For example, the combination of field effect transistors and organic electroluminescent lamps can form an active matrix array for an optical display. Some useful embodiments are donor laminate elements for forming a polymer dispersed LC display, an OLED based display or lighting, or touch screens including resistive-type or capacitive-type touch screens, RFID tags, EMI shields, PCB's, and flexible or rigid photovoltaic devices.

The laminate donor elements include a donor substrate, a metal grid comprising two or more metal lines (generally a plurality of metal lines) that are disposed over only portions the donor substrate surface. Thus, other portions of the donor substrate surface are uncovered by the metal grid comprising the metal lines. In general, at least 0.01% and up to and including 99.99%, or typically at least 10% and up to and including 99.99% of the donor substrate surface area is uncovered by the metal grid. Thus, at least 0.01% and up to and including 99.99% of the donor substrate surface area is covered by the metal grid.

The electronically conductive polymer layer is configured to directly cover the portions of the donor substrate that are not covered by the metal grid, forming a composite of metal grid and electronically conductive polymer. When transfer is achieved from the laminate donor element to a receiver sheet, the composite of metal grid and electronically conductive polymer is reversed, resulting in a reverse composite in which the metal grid is generally exposed and arranged outermost in the receiver sheet, for example in the outermost part of an adhesive layer. As described below, the receiver sheet or other articles can comprises an adhesive layer that covers at least a portion (typically all) of the receiver substrate surface area, and the reverse composite can be disposed over the adhesive layer, for example in a random or predetermined pattern.

While the present invention is amenable to various modifications and alternative forms, specific embodiments thereof are shown by illustrations in the drawings. It should be understood, however, that the intention is not to limit the invention to the particular embodiments described herein. On the contrary, the intention is to cover all modifications, equivalents, and alternatives falling within the spirit and scope of the invention.

The term "device" includes an electronic or optical component that can be used alone or used with other components to form a larger system, such as an electronic circuit.

The term "active device" includes an electronic or optical component capable of a dynamic function, such as amplification, oscillation, or signal control, and can require a power supply for operation.

The term "passive device" includes an electronic or optical component that is basically static in operation (that is, it is ordinarily incapable of amplification or oscillation) and requires no power for characteristic operation.

The term "operational layer" includes layers that are utilized in the operation of a device, such as a multilayer active or passive device. Examples of operational layers include layers that act as insulating, conducting, semiconducting, superconducting, waveguiding, frequency multiplying, light producing (for example, luminescing, light emitting, fluorescing or phosphorescing), electron producing, hole producing, magnetic, light absorbing, reflecting, diffracting, phase retarding, scattering, dispersing, refracting, polarizing, or diffusing layers in the device or layers that produce an optical or electronic gain in the device.

The term "auxiliary layer" includes layers that do not perform a function in the operation of the device, but are provided solely, for example, to facilitate transfer of a layer to a receiver sheet, to protect layers of the device from damage or contact with outside elements, or to adhere the composite of metal grid and electronically conductive polymer to the receiver sheet. An adhesive or adhesive layer can be considered an auxiliary layer.

Unless otherwise indicated herein, when used to define various components, chemicals, or materials, the articles "a", "an", and "the" refer to one or more (plurality) of those components, chemicals, or materials.

Laminate Donor Elements

Further details of the laminate donor element are provided as follows, and some embodiments of laminate donor elements are illustrated in FIGS. 1, 2, 3a, 3b, 4, 5, and 6.

Referring to FIG. 1, laminate donor element 10 has donor substrate 12 on which is disposed a metal grid having multiple metal lines 14 disposed on donor substrate 12 and electronically conductive polymer 16 directly covering the portions of donor substrate 12 that are uncovered by multiple metal lines 14 of the metal grid. Multiple metal lines 14 and electronically conductive polymer 16 thus form a composite of metal grid and electronically conductive polymer that is defined in more detail below. In FIG. 1, multiple metal lines 14 are illustrated as having the same square cross-sectional shape with fairly defined corners, but as a skilled worker would appreciate, the metal lines in a metal grid are not always deposited in such uniformly defined shapes. Thus, the metal lines can have a cross-sectional shape that is irregular or that is a different regular shape (for example, rectangular, or a trapezoidal or rounded cross-sectional shape as in FIGS. 4 and 5, respectively). Thus, the plurality of metal lines in the metal grid can have the same or different cross-sectional shape, thickness (width), height, or composition, as described in more detail below.

Figure 2:
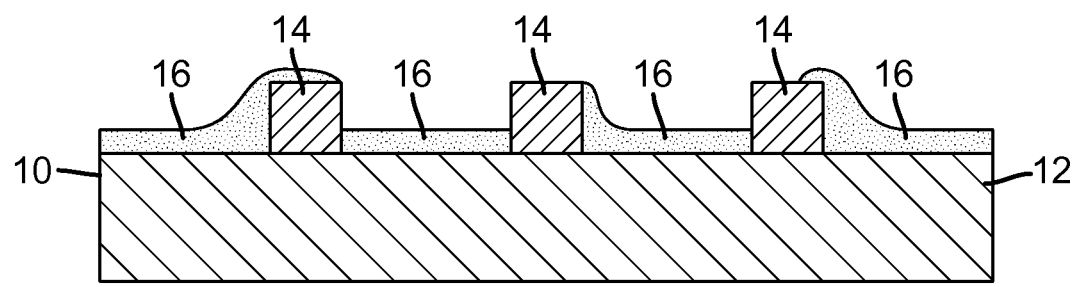

In FIG. 2, electronically conductive polymer 16 is shown as covering the portions of donor substrate 12 that are uncovered by multiple metal lines 14 of the metal grid, as well as at least some portion of one or more of the multiple metal lines 14. As illustrated, the electronically conductive polymer can cover one or more sides, the top, or parts of one or more sides or the top, of one or more metal lines.

Figure 3A:
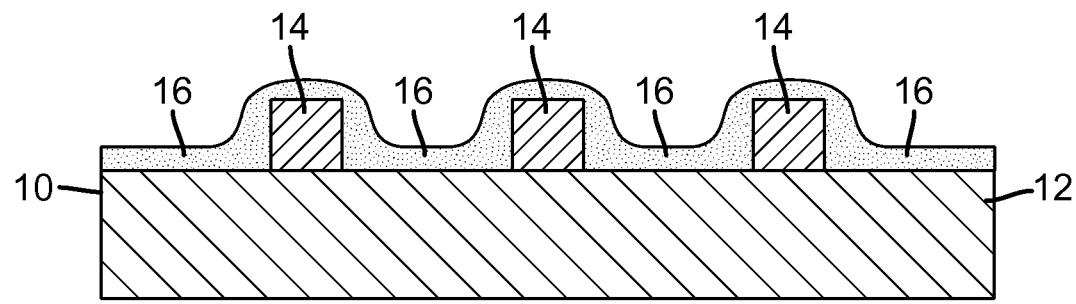
Figure 3B:
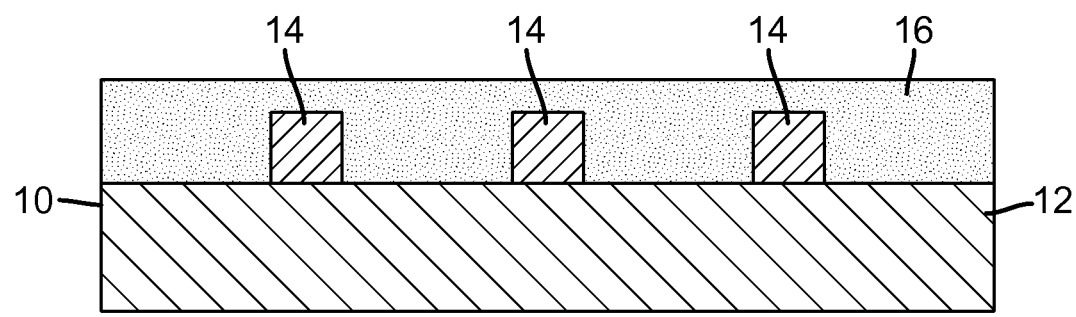
Figure 4:
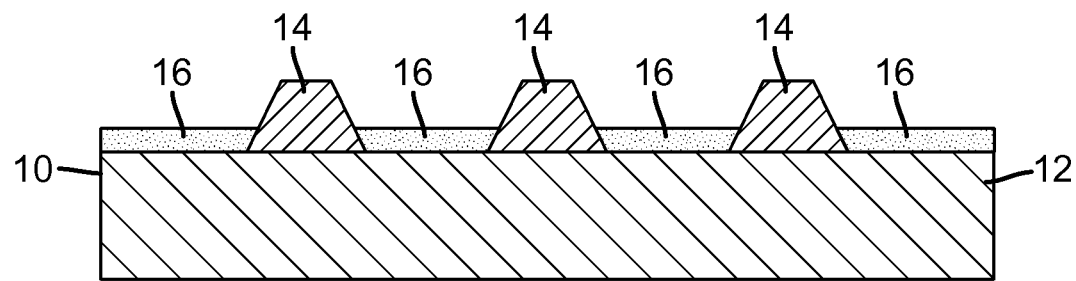
Figure 5:
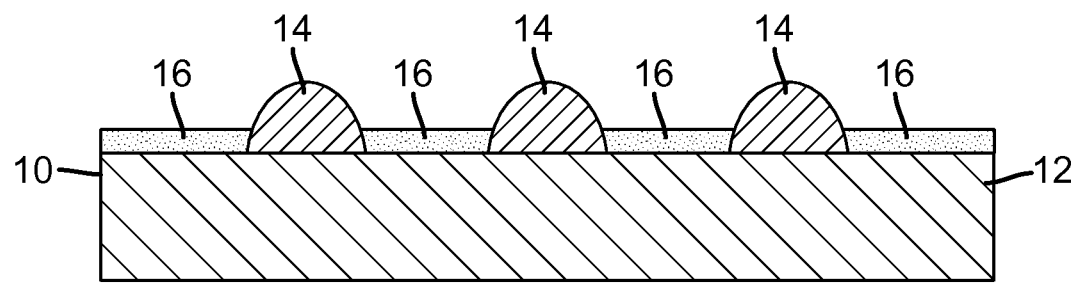

FIG. 3a illustrates still another embodiment in which electronically conductive polymer 16 completely covers the portions of donor substrate 12 uncovered by multiple metal lines 14 of the metal grid, and also completely covers the multiple metal lines 14. In this embodiment, there are "valleys" in the coating of electronically conductive polymer 16 between the multiple metal lines 14. However, in FIG. 3b, electronically conductive polymer 16 is present to provide a uniform outer surface over the plurality of multiple metal lines 14.

Figure 6:
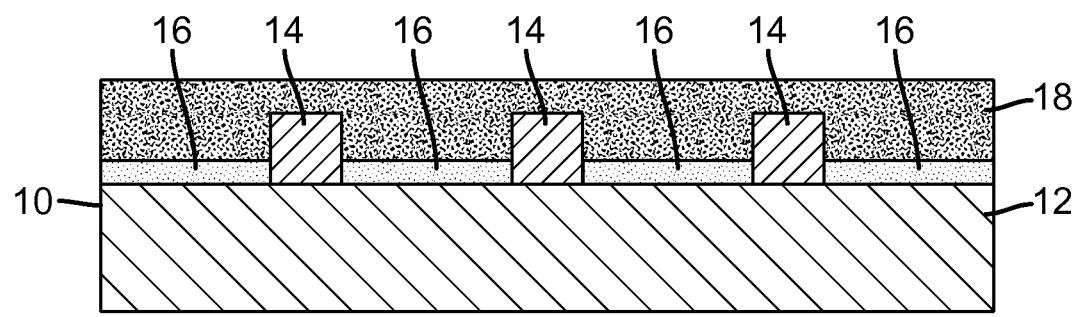

Referring to FIG. 6, laminate donor element 10 further comprises adhesive 18 over both the plurality of multiple metal lines 14 and electronically conductive polymer 16 disposed on donor substrate 12. While adhesive 18 is shown as a uniform continuous layer, it need not have a uniform outer surface and its thickness need not be uniform in other embodiments. In some embodiments, the adhesive can be patterned to match the pattern of the metal grid, or the adhesive can be arranged as a layer with non-uniform thickness.

The donor substrate used in the laminate donor element can be transparent, translucent, or opaque, rigid or flexible, and can be colored or colorless. For many applications, the donor substrate is "transparent", which means that it transmits at least 40%, at least 60%, or more likely at least 70%, of incident visible light having a wavelength of at least 450 nm and up to and including 700 nm. For example, useful donor substrates are also transparent to laser radiation to facilitate transfer of the composite of metal grid and electronically conductive polymer to a receiver sheet. Rigid substrates can include but are not limited to, glass, metal, ceramic and semiconductive materials. Flexible substrates, especially those comprising flexible and transparent glass or plastic materials, are useful for their versatility and ease of manufacturing, coating, and finishing. Flexible plastic substrates can be any flexible self-supporting plastic film that supports the composite of metal grid and electronically conductive polymer. The term "plastic" refers to a high polymer, usually made from polymeric synthetic resins, which can be combined with other ingredients, such as curatives, fillers, reinforcing agents, colorants, and plasticizers. Plastics also include thermoplastic materials and thermosetting materials.

The donor substrates can have sufficient thickness and mechanical integrity so as to be self-supporting, yet they need not be so thick as to be rigid. Another significant characteristic of flexible substrate materials, especially polymeric films, are their glass transition temperatures (Tg) that are defined as the temperature at which the polymeric material will change from the glassy state to the rubbery state. It can comprise a range of temperatures before the material actually flows. Suitable materials for the flexible donor substrates include films of thermoplastics of a relatively low glass transition temperature, for example up to 150° C., as well as materials of a higher glass transition temperature, for example, above 150° C. The choice of material for the flexible polymer donor substrate would depend on factors such as manufacturing process conditions, such as deposition temperature, and annealing temperature, as well as post-manufacturing conditions such as in a process line of a displays manufacturer. Certain of the polymer donor substrates discussed below can withstand higher processing temperatures of up to at least about 200° C. and up to and including 350° C., without damage.

Although various examples of polymer donor substrates are described below, it should be appreciated that the flexible donor substrates can also be formed from other materials such as flexible glasses and ceramics.

Typically, a useful polymer donor substrate can be a polyester including but not limited to, poly(ethylene terephthalate) (PET), poly(ethylene naphthalate) (PEN), poly(butylene terephthalate), poly(1,4-cyclohexylene dimethylene terephthalate), polyester ionomers, amorphous polyester such as amorphous glycol modified PET (PETG), polyethersulfone (PES), polycarbonate (PC), polysulfone, a phenolic resin, an epoxy resin, polyester, polyimide, polyetherester, polyetheramide, cellulose nitrate, cellulose acetate, poly(vinyl acetate), polystyrene, polyolefins including polyolefin ionomers, polyamide, aliphatic polyurethanes, polyacrylonitrile, polytetrafluoroethylenes, polyvinylidene fluorides, poly(methyl (x-methacrylates), an aliphatic or cyclic polyolefin, polyacrylate (PAR), polyetherimide (PEI), polyethersulfone (PES), polyimide (PI), Teflon poly(perfluoro-alkoxy)fluoropolymer (PFA), poly(ether ether ketone) (PEEK), poly(ether ketone) (PEK), poly(ethylene tetrafluoroethylene)fluoropolymer (PETFE), poly(methyl methacrylate) and various acrylate/methacrylate copolymers (PMMA), natural and synthetic paper, resin-coated or laminated papers, voided polymers including polymeric foam, microvoided polymers, and microporous materials, and fabrics, and any combinations thereof. Aliphatic polyolefins can include high density polyethylene (HDPE), low density polyethylene (LDPE), and polypropylene, including oriented polypropylene (OPP).

Particularly useful flexible donor substrates are composed of polyesters or cellulose acetate because of their superior mechanical and thermal properties as well as their availability in large quantity at a moderate price. A cellulose such as cellulose triacetate, also known as triacetyl cellulose (or TAC) also can be used. The manufacture of TAC films by a casting process is well known and includes casting a TAC solution in organic solvent (dope) on a drum or a band, and evaporating the solvent to form a film. Before casting the dope, the concentration of the dope is typically so adjusted, as described for example in U.S. Pat. No. 7,781,047 (Majumdar et al., Col. 7, and lines 32ff).

A plasticizer can be added to a cellulose acetate film to improve the mechanical strength of the film. Useful plasticizers include but are not limited to, phosphoric esters and carboxylic esters (such as phthalic esters and citric esters) such as triphenyl phosphate (TPP), tricresyl phosphate (TCP), and phthalic esters such as dimethyl phthalate (DMP), diethyl phthalate (DEP), dibutyl phthalate (DBP), dioctyl phthalate (DOP), diphenyl phthalate (DPP) and diethylhexyl phthalate (DEHP), citric esters such as o-acetyltriethyl citrate (OACTE) and o-acetyltributyl citrate (OACTB). The amount of the plasticizer can be at least 0.1 weight % and up to and including 25 weight %.

The particular polyester chosen for use as the donor substrate can be a homo-polyester or co-polyester, or mixtures thereof as desired, which polyester can be crystalline or amorphous or mixtures thereof as desired.

The donor substrate can be planar or curved with a curvature that can be characterized by a predetermined radius of curvature. Alternatively, the donor substrate can be bent so as to form an angle of from 0° to 360°. The donor substrate can be of any thickness, such as, for example, at least $10^{-8}$ cm and up to and including 1 cm, or at least 0.001 mm and up to and including 10 mm especially for polyester substrates, to optimize physical properties and cost. The donor substrate need not have a uniform thickness. Its planar shape can be square, rectangular, circular or any other regular or irregular shape. Before formulations, compositions, or metal grids are applied to the donor substrate, it can be treated (see below) for various purposes.

The donor substrate can comprise one or more layers as well as the composite of metal grid and electronically conductive described below. Such layers can be on the same or opposite side as the composite of metal grid and electronically conductive polymer, and can include but are not limited to, antistatic layers, abrasion resistant layers, curl control layers, conveyance layers, barrier layers, splice providing layers, UV, visible or infrared light absorption layers, optical effect providing layers (such as antireflective and antiglare layers), waterproofing layers, adhesive layers, release layers, magnetic layers, interlayers, imageable layers such as electrically imageable layers that can comprise light modulating materials. Adhesive layers that are directly applied to the donor substrate are useful, and adhesives (complete or partial layers) that are applied to the composite of metal grid and electronically conductive polymer are also useful in some embodiments.

In some embodiments, the donor substrate comprises a release material or layer on the surface of the donor substrate that is in contact with the composite of metal grid and electronically conductive polymer. This release layer can facilitate the separation of the composite of metal grid and electronically conductive layer from the donor substrate after the transfer process (described below). Suitable materials for use in the release layers include but are not limited to, polymeric materials such as silicones or polysiloxanes, poly(vinyl butyral)s, cellulosics, poly(meth)acrylates, polycarbonates, and poly(acrylonitrile-co-vinylidene chloride-co-acrylic acid).

The donor substrate can be formed by any method known in the art such as extrusion, co-extrusion, quenching, orientation, heat setting, lamination, coating, and solvent casting processes. The donor substrate can be an oriented sheet formed by any suitable method known in the art, such as by a flat sheet process (extrusion) or a bubble or tubular process. Alternatively, the sheet can be formed by casting a solution of the sheet material onto a drum or band and evaporating the solvent from the solution.

The sheet thus formed is then oriented by stretching uniaxially or biaxially in mutually perpendicular directions at a temperature above the glass transition temperature of the polymer(s) using known procedures. The stretch ratio in any direction can be at least 3:1. After the sheet has been stretched, it can be heat-set by heating to a temperature sufficient to crystallize the polymers while restraining to some degree the sheet against retraction in both directions of stretching.

The donor substrate polymer sheet can be subjected to any number of coatings and treatments, after casting, extrusion, co-extrusion, or orientation, or between casting and full orientation, to improve or optimize its properties, such as printability, barrier properties, heat-sealability, and spliceability, adhesion to other substrates or imaging layers. Examples of such treatments can be flame, plasma and corona discharge treatment, ultraviolet radiation treatment, ozone treatment, electron beam treatment, acid treatment, alkali treatment, saponification treatment to improve or optimize any property, such as coatability and adhesion. Further examples of treatments can be calendaring, embossing and patterning to obtain specific effects on the surface of the web.

The metal grid present in the laminate donor element comprises any suitable metal or metal alloy. Particularly useful are conductive metals and alloys comprising lithium, beryllium, magnesium, strontium, barium, yttrium, lanthanum, titanium, zirconium, cerium, vanadium, niobium, tantalum, chromium, molybdenum, tungsten, neodymium, iron, ruthenium, cobalt, rhodium, iridium, nickel, palladium, platinum, gadolinium, copper, silver, gold, terbium, zinc, cadmium, aluminum, gallium, indium, silicon, germanium, tin, lead, antimony, tellurium, and others that would be readily apparent to one skilled in the art. Particularly useful metal grids comprise at least one metal selected from the group consisting of silver, gold, copper, platinum, palladium, indium, tin, aluminum, and mixtures thereof. A particularly useful metal grid consists essentially of two or more silver lines.

A useful metal layer can be formed by any sputtering technique such as magnetron sputtering, direct current (DC) sputtering, radio frequency (RF) sputtering, RF-DC sputtering, or by evaporation using thermal energy or e-beam. Electrochemical deposition of the metal is also useful.

Alternatively, the metal grid can be formed by coating or printing and drying a wet composition comprising metal particles (for example, flakes, needles, fibers, nanowires, colloids, and dispersions) onto the donor substrate, followed by appropriate drying. Dispersions of metal nanoparticles can be used because of their relatively low sintering temperatures (below 350° C.) that promote deposition of the metal grid onto polymeric (plastic) donor substrates. Cabot PED's silver nanoparticles (spherical, about 50 nm in diameter) can be used in this manner. Also suitable for use are various silver inks that are available for example from PChem Associates, silver particles or inks that are available for example from CIMA Nanotech, or silver nanowires that are available for example from Seashell or Bluenano.

The coating or printing process can involve any known technology such as air knife coating, gravure coating, hopper or slot die coating, curtain coating, roller coating, spray coating, electrochemical coating, flexographic printing, rotogravure printing, lithographic printing, intaglio printing, relief printing, screen printing, inkjet printing, laser printing, stamping, and other techniques that would be readily apparent to a worker skilled in the art.

In other processes, a metal grid is formed from a low temperature decomposition of a coating comprising an organometallic or reactive organic medium as described for example in U.S. Pat. No. 7,410,825 (Majumdar et al., Col. 14, lines 27ff).

In one particularly useful embodiment, a silver ink comprising silver nanoparticles (such as one that is available from PChem Associates) can be printed as an interconnected grid or mesh form using a flexographic printing method on a suitable donor substrate (such as corona discharge-treated PET or TAC) and dried. In other embodiments, the printing method can include inkjet printing, screen printing, or stamping techniques.

In yet another particularly useful embodiment a silver ink comprising more than one solvents (such as a silver ink that is available from CIMA Nanotech for its SANTE nanoparticle coating) can be uniformly coated on a suitable donor substrate (such as corona discharge treated PET or TAC) and dried to form an interconnected mesh due to the self-assembly of the silver particles during drying (as described for example in U.S. Pat. No. 7,566,360 of Garbar et al.).

The metal grid comprises two or more metal lines, and in most cases, a plurality of metal lines, that can be disposed over only portions of the donor substrate in a random arrangement or pattern, or in a predetermined pattern, for example wherein parallel metal lines are an average of at least 10 nm apart. Other predetermined patterns of metal lines can include circles, ovals, squares, rectangles, or other regular or irregular geometric shapes. The junctions of multiple metal lines can have the same or different width and thickness as the adjoining metal lines. To obtain either random or patterned lines, the metal can be applied from an ink to the donor substrate by flexographic printing, rotogravure printing, lithographic printing, intaglio printing, relief printing, screen printing, inkjet printing, laser printing, stamping or coating of self-alipable metal particles in one or more solvents by drying. The metal grid is disposed over (or in direct contact with) only portions of the donor substrate, leaving other portions of the donor substrate uncovered by the metal grid, as noted above.

Each metal line of the metal grid generally has an average width of at least 0.01 μm and up to and including 500 μM and typically at least 1 μm and up to and including 50 μm. Each metal line of the metal grid generally has an average height of at least 0.01 μm and up to and including 10 μm, and typically of at least 0.1 μm and up to and including 1 μm. These "average" values are determined by known interferometry techniques. Thus, in some embodiments, each metal line of the metal grid has an average width of at least 0.01 μm and up to and including 500 μm and an average height of at least 0.01 μm and up to and including 10 μm. Thus, in many embodiments, the metal lines have a rectangular cross-sectional shape.

The metal grid lines consist essentially of a metal or mixtures of the metals described above. They optionally include non-essential addenda such as those described below for the electronically conductive polymer layer.

The laminate donor element used in this invention comprises one or more electronically conductive polymers that can be chosen from one or more members of the group consisting of substituted or unsubstituted pyrrole-containing polymers (as mentioned for example in U.S. Pat. Nos. 5,665,498 and 5,674,654, both noted above), substituted or unsubstituted thiophene-containing polymers (as mentioned for example, in U.S. Pat. Nos. 5,300,575, 5,312,681, 5,354,613, 5,370,981, 5,372,924, 5,391,472, 5,403,467, 5,443,944, 4,987,042, and 4,731,408, all noted above) and substituted or unsubstituted aniline-containing polymers (as mentioned for example in U.S. Pat. Nos. 5,716,550, 5,093,439, and 4,070,189, all noted above). Particularly suitable electronically conductive polymers are those present in their cationic form and comprise a polyanion. Examples of such polymers are disclosed in U.S. Pat. No. 5,665,498 (noted above) and U.S. Pat. No. 5,674,654 (noted above) for substituted or unsubstituted pyrrole-containing polymers and U.S. Pat. No. 5,300,575 (noted above) for substituted or unsubstituted thiophene-containing polymers. Among these, the substituted or unsubstituted thiophene-containing polymers are useful because of their light and heat stability, dispersion stability and ease of storage and handling. For example, one or more of such substituted or unsubstituted thiophene-containing polymer can be used in combination with a metal grid consisting essentially of silver metal lines (described above).

Preparation of useful substituted or unsubstituted thiophene-containing polymers is discussed in detail in a publication titled "Poly(3,4-ethylenedioxythiophene) and Its Derivatives: Past, Present, and Future" by L. B. Groenendaal, F. Jonas, D. Freitag, H. Pielartzik and J. R. Reynolds in Advanced Materials, (2000), 12, No. 7, pp. 481-494, and references cited therein.

In some embodiments, the electronically conductive polymer is prepared by applying a mixture comprising:
a) a polythiophene according to Formula I:

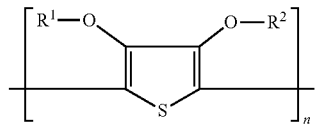

Formula I in a cationic form, wherein each of $R^1$ and $R^2$ independently represents hydrogen or a $C_{1-4}$ alkyl group or together represent an optionally substituted $C_{1-4}$ alkylene group or a cycloalkylene group, an optionally alkyl-substituted methylene group, an optionally $C_{1-12}$ alkyl- or phenyl-substituted 1,2-ethylene group, a 1,3-propylene group or a 1,2-cyclohexylene group; and n is 3 to 1000, and b) a polyanion compound.

The electronically conductive polymer and polyanion combination is either soluble or dispersible in organic solvents or water or mixtures thereof. Polyanions used with these electronically conductive polymers include but are not limited to, the anions of polymeric carboxylic acids such as polyacrylic acids, poly(methacrylic acid), and poly(maleic acid), and polymeric sulfonic acids such as poly(styrenesulfonic acid)s and poly(vinyl sulfonic acid)s. These polycarboxylic and polysulfonic acids can also be copolymers formed from vinyl carboxylic and vinyl sulfonic acid monomers that are copolymerized with other polymerizable monomers such as the esters of acrylic acid and styrene. The weight ratio of electronically conductive polymer to the polyanion can be from 1:99 to 99:1 or more likely from 50:50 to 15:85.

The molecular weight of the polyacids providing the polyanions generally is at least 1,000 and up to and including 2,000,000 and typically at least 2,000 and up to and including 500,000. The polyacids or their alkali salts are commonly available, for example as poly(styrenesulfonic acid)s and poly(acrylic acid)s, or they can be produced using known methods. The polythiophene to polyanion weight ratio can widely vary of from 1:99 to 99:1. The electronically conductive polymers include poly(3,4-ethylene dioxythiophene styrene sulfonate) that comprises poly(3,4-ethylene dioxythiophene) in a cationic form and polystyrene sulfonic acid.

Unless otherwise indicated, the term "electronically conductive polymer" is also intended in defining embodiments of this invention, to include a polyanion compound with the cationic polymeric material.

Particularly suitable electronically conductive polymers are those sold under the Clevios™ brand as supplied by Heraeus (for example, Clevios™ PH 500, Clevios™ PH 1000, and others known from their product literature).

Enhanced conductivity of the electronically conductive polymer can be accomplished by incorporating a conductivity enhancing agent (CEA). Useful CEA's include organic compounds containing dihydroxy, poly-hydroxy, carboxyl, amide, or lactam groups, such as:

(1) those represented by the following Formula II:

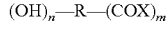

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (2) a sugar, sugar derivative, polyalkylene glycol, or glycerol compound;

(3) those selected from the group consisting of N-methylpyrrolidone, pyrrolidone, caprolactam, N-methyl caprolactam, dimethyl sulfoxide or N-octylpyrrolidone; or (4) a combination of the above.

Useful conductivity enhancing agents include but are not limited to, are sugar and sugar derivatives such as sucrose, glucose, fructose, lactose, sugar alcohols such as sorbitol and mannitol, furan derivatives such as 2-furancarboxylic acid and 3-furancarboxylic acid, alcohols such as ethylene glycol, glycerol, and di- or tri-ethylene glycol.

The CEA can be incorporated by any suitable method. The CEA can be added to the coating composition comprising the electronically conductive polymer and the polyanion. Alternatively, the coated and dried electronically conductive polymer layer can be exposed to the CEA by any suitable method, such as a post-coating wash. The concentration of the CEA in the coating composition can vary widely depending on the particular organic compound used and the conductivity requirements. However, useful concentrations are at least 0.5 weight % or at least 5 weight %, and up to and including 25 weight %, or up to and including 10 weight %, based on the total dry weight of the electronically conductive polymer. More likely, the amount of a CEA would be at least 0.5 weight % and up to and including 5 weight %.

The electronically conductive polymer used in this invention can be applied to the donor substrate to at least directly cover most or all of the portions of the donor substrate that are uncovered by the metal grid (described above) as a layer to form a composite of metal grid and electronically conductive polymer using any method known in the art. Useful methods include coating from a suitable coating composition by any well known coating method such as air knife coating, gravure coating, hopper coating, curtain coating, roller coating, spray coating, electrochemical coating, inkjet printing, flexographic printing, or stamping. The electronically conductive polymer layer is formed so that it directly (no intermediate materials) covers the uncovered portions of the donor substrate. This means that no gaps are intentionally designed for the electronically conductive polymer layer, and if any gaps occur, they are accidental.

In a particularly useful embodiment, a composition comprising the electronically conductive polymer and the polyanion and a suitable amount of CEA can be applied (for example, coated) over the metal lines of the metal grid using slot die or gravure coating methods and appropriately dried.

As noted above, the electronically conductive polymer can also at least partially cover some or all metal lines of the metal grid surface area and in some embodiments, the electronically conductive polymer completely covers the metal grid surface area. However, in most instances, less than 10% of the metal grid surface area is covered by the electronically conductive polymer. In general, the electronically conductive polymer in the composite of the metal grid and the electronically conductive polymer has an average thickness of at least 0.01 µm and up to and including 10 µm, as determined using known procedures.

While the electronically conductive polymer layer can be formed using the electronically conductive polymer as the sole polymeric material, the mixing of a non-electronically conductive film-forming polymeric binder with the electronically conductive polymer can improve the physical properties of the resulting layer on the donor substrate. However, the presence of any additional non-electronically conductive film-forming polymeric binder can increase the overall surface electrical resistivity of the resulting layer. The optimum weight percent of the non-electronically conductive film-forming polymer binder varies depending on the electrical properties of the electronically conductive polymer, the chemical composition of the non-electronically conductive film-forming polymeric binder, and the requirements for the resulting laminate donor element.

Useful non-electronically conductive film-forming polymeric binders include but are not limited to, water-soluble or water-dispersible hydrophilic polymers such as gelatin, gelatin derivatives, maleic acid or maleic anhydride copolymers, polystyrene sulfonates, cellulose derivatives (such as carboxymethyl cellulose, hydroxyethyl cellulose, cellulose acetate butyrate, diacetyl cellulose, and triacetyl cellulose), polyethylene oxide, polyvinyl alcohol, and poly-N-vinylpyrrolidone. Other suitable non-electronically conductive film-forming polymeric binders include aqueous emulsions of addition-type homopolymers and copolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes and polyesterionomers.

Other addenda that can be mixed with the electronically conductive polymer include but are not limited, to surfactants, defoamers or coating aids, charge control agents, thickeners or viscosity modifiers, antiblocking agents, coalescing aids, crosslinking agents or hardeners, soluble or solid particle dyes, matte beads, inorganic or polymeric particles, adhesion promoting agents, bite solvents or chemical etchants, lubricants, plasticizers, antioxidants, colorants or tints, and other materials that are well-known in the art. Useful bite solvents include any of the volatile aromatic compounds disclosed in U.S. Pat. No. 5,709,984 (Chen et al.) as "conductivity-increasing" aromatic compounds such as resorcinol and 4-chloro-3-methyl phenol. Useful surfactants include nonionic and anionic surfactants. Useful cross-linking agents include silane compounds such as those disclosed in U.S. Pat. No. 5,370,981 (noted above).

The electronically conductive polymer layer can also be mixed with materials that facilitate absorption of laser radiation, such as dyes and particulate absorbers. When a laser used for composite transfer is an infrared laser, carbon black as well as IR-absorbing dyes and pigments can be mixed with the electronically conductive polymer.

The electronically conductive polymer composition used in this the invention generally comprises at least 0.001 $g/m^2$ and up to and including 10 $g/m^2$ and typically at least 0.01 $g/m^2$ and up to and including 1 $g/m^2$ of dry coating coverage of one or more electronically conductive polymers as described above. The desired dry coating weight of the electronically conductive polymer is determined by the properties of the particular electronically conductive polymer used and by the requirements of the particular laminate donor element such as desired conductivity, transparency, optical density and materials cost for the layer. Generally, the amount of the one or more electronically conductive polymers in the electronically conductive polymer composition is at least 1 weight %, and typically at least 50 weight % and up to 100 weight %, based on total composition solids.

The composite of metal grid and electronically conductive polymer can exhibit various transmittance values of UV, visible, or infrared radiation. It is generally desired that it be designed using electronically conductive polymer(s), metal (s), and any desired addenda (microparticles, non-electronically conductive polymers, etc.) have a transparency or light transmission value T≥40%, or typically ≥60%, and or more likely ≥70%.

For some specific display applications, such as those involving organic or polymeric light emitting diodes, the surface roughness of the composite of metal grid and electronically conductive polymer can be critical. Typically, a very smooth surface, with low roughness (Ra, roughness average) is desired for maximizing optical and barrier properties of the coated substrate.

As noted above, the laminate donor element can include layers besides the composite of metal grid and electronically conductive polymer. For example, an adhesive layer can be disposed over some or completely cover the composite of metal grid and electronically conductive layer. In most embodiments, the adhesive covers at least 10% of the surface area of the donor substrate (and thus, a corresponding amount of the surface area of the composite of metal grid and electronically conductive layer, depending upon its coverage of the donor substrate surface area). Thus, the term "adhesive layer" is not intended to mean that the adhesive always completely covers the donor substrate or composite of metal grid and electronically conductive polymer. The adhesive can cover the donor substrate in a random manner or in a predetermined pattern.

Useful adhesive materials include can be a pressure sensitive adhesive layer comprising a low $T_g$ polymer (that is, less than 50° C.), a heat activated adhesive layer comprising a thermoplastic polymer, or a thermally or radiation curable adhesive layer. Examples of suitable polymers for use in the adhesives include but are not limited to, an epoxy, acrylate polymers, vinyl polymers, polyolefins, polyimine, polyurethanes, polyesters, polycarbonates, polystyrenes, polysiloxane, and other polymers well known in the adhesives industry, and mixtures thereof. In some embodiments, the adhesive layer and release layer (described above) can be the same material and serve multiple functions in the laminate donor element. In addition, the adhesive used in the laminate donor element can be the same or different from the adhesive used in the receiver sheet (described below).

As noted above, the composite of metal grid and electronically conductive polymer exhibits a peel force of less than or equal to 40 g/cm for separation of the donor substrate from the composite of metal grid and electronically conductive polymer at room temperature (20-25° C.). More typically, the composite of metal grid and electronically conductive polymer exhibits a peel force of at least 0.01 g/cm and up to and including 40 g/cm at room temperature. Typically, this peel force is at least 0.02 g/cm and up to and including 25 g/cm. This peel force test can be determined with a given donor substrate and composite of metal grid and electronically conductive polymer as described below.

Some embodiments of the laminate donor element comprises a donor substrate that is a transparent film comprising a polyester that has an average thickness of at least 0.001 mm and up to and including 10 mm, and a composite of metal grid and electronically conductive polymer that comprises an electronically conductive polymer that is a substituted or unsubstituted thiophene-containing polymer, and a metal grid that consists essentially of silver metal lines. The metal grid consisting essentially of two or more silver lines is in direct contact with only portions of the donor substrate.

It would be obvious to one skilled in the art that a wide variety of donor laminate element configurations using various combinations of donor substrates, electronically conductive polymers, and metal grids, with optional layers, can be constructed depending upon the type of article (or device) that is desired and the method of transferring the composite of electronically conductive polymer and metal grid to a receiver sheet (described below).

Articles and Assemblies

As noted above, an article of this invention comprises an article substrate that has thereon, in order, an adhesive layer and a reverse composite comprising an electronically conductive polymer layer and metal grid such that the metal grid is disposed over the adhesive layer and the voids of the metal grid are filled by the electronically conductive polymer, and at least some of the metal grid uncovered. This article can be obtained in any suitable manner in which a metal grid is needed in an outermost surface. The article can be prepared using the materials and methods described above. This article is not limited to those described herein that serve as receiver articles in a transfer method. Rather, such articles can be prepared and used for other purposes that a skilled worker would appreciate from the teaching herein.

In many embodiments, the article of this invention can be obtained by transferring the composite of electronically conductive polymer and metal grid to a suitable receiver sheet that comprises a suitable receiver substrate, and optionally an adhesive layer disposed thereon. A "reverse" composite is formed on the receiver substrate. This reverse composite thus comprises the metal grid disposed on the outer surface of the adhesive layer (or the outer surface of the electronically conductive polymer if the adhesive is absent). The resulting voids among the metal grid lines are filled by the electronically conductive polymer (that can be in the form of a continuous layer). Thus, upon transfer, the composite of metal grid and electronically conductive polymer from the laminate donor element is "flipped" or reversed so that the metal grid is now disposed directly on the outer surface of the adhesive layer (or electronically conductive polymer) on the receiver substrate. In most instances, the transparency of the reverse composite in the receiver sheet will be essentially the same as the transparency of the composite of metal grid and electronically conductive polymer in the laminate donor element.

The articles, assemblies, and methods forming them can be understood also by reference to FIGS. 7A, 7B, 8, and 9.

Figure 7A:
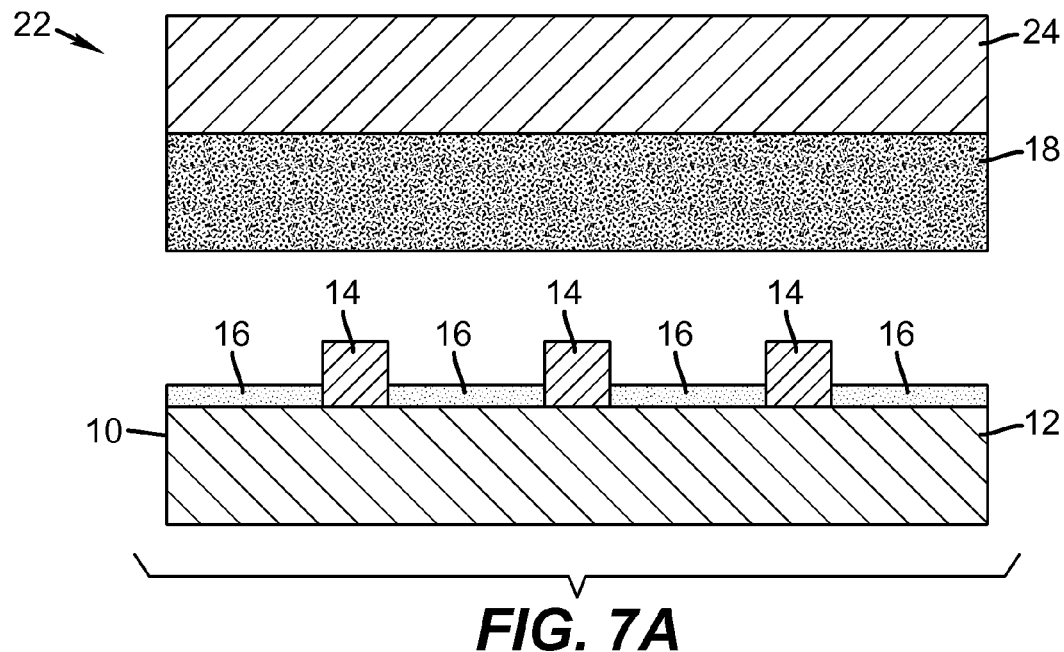
FIG. 7A is a cross-sectional view of a donor laminate element of this invention and a receiver sheet being brought into proximity with each other.
Figure 7B:
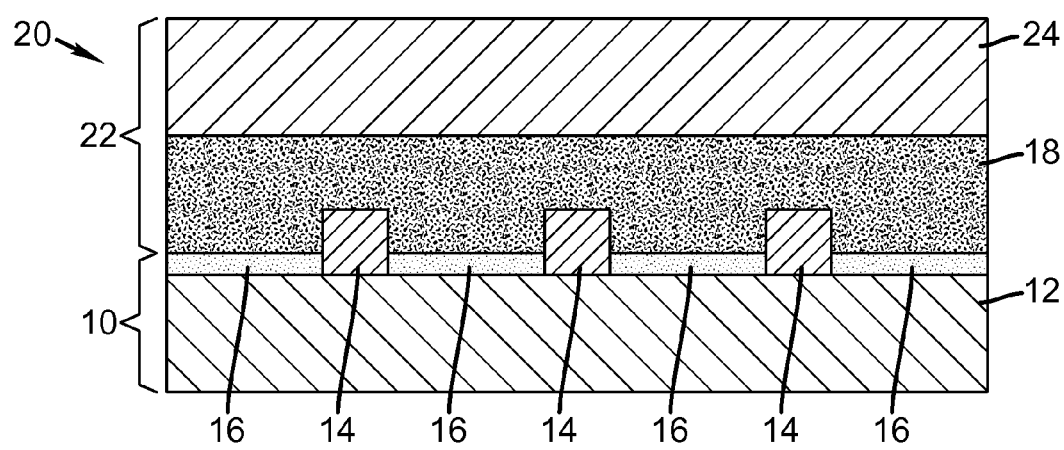
FIG. 7B is a cross-sectional view of an assembly formed by bringing together the donor laminate element of this invention and the receiver sheet shown as shown in FIG. 7A.

Referring to FIG. 7A, donor element 10 is brought into proximity to receiver sheet 22 having receiver substrate 24 and adhesive 18. These two elements then can be used to form assembly 20 that is illustrated in FIG. 7B.

Figure 8:
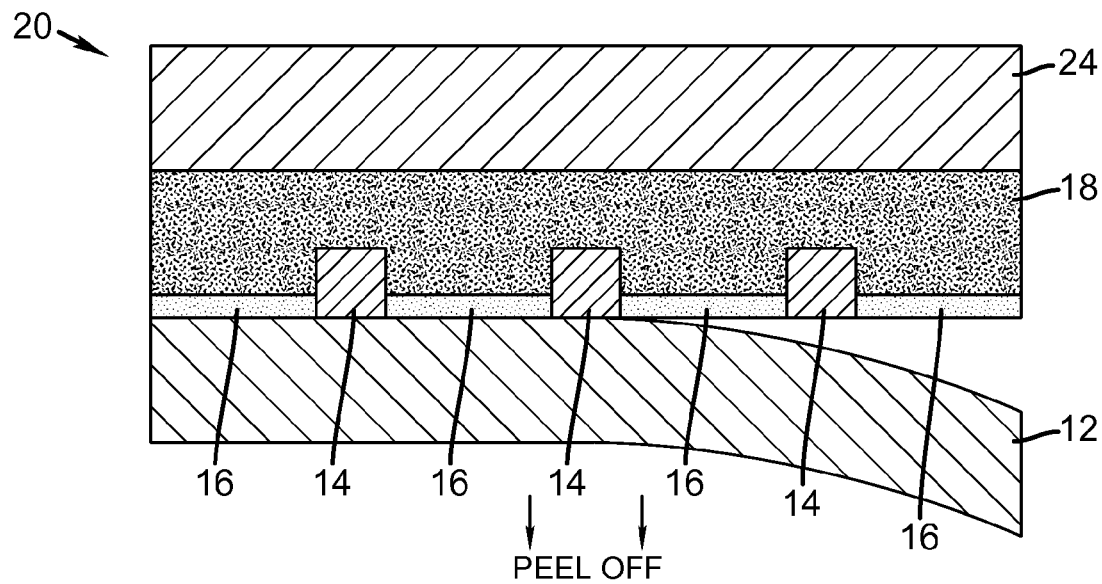
FIG. 8 is a cross-sectional view of the assembly of FIG. 7B from which the donor substrate is being pulled off.
Figure 9:
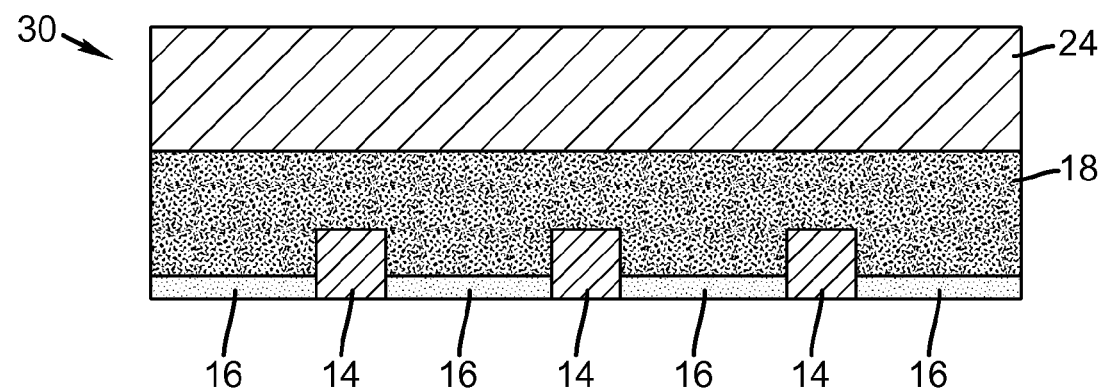
FIG. 9 is a cross-sectional view of an article formed by a receiver sheet and a reverse composite after transfer of the composite of metal grid and electronically conductive polymer from a laminate donor element.

Once transfer of the composite of metal grid and electronically conductive polymer is achieved (described below), donor substrate 12 can be pulled off assembly 20 as illustrated in FIG. 8. Optionally, a release layer (not shown) is interposed between donor substrate 12 and the composite of metal grid (multiple metal lines 14) and electronically conductive polymer 16. The result, shown in FIG. 9, is article 30 having receiver substrate 24 (could also be generally an article substrate), adhesive 18 directly disposed thereon and a reverse composite comprised a metal grid with multiple metal lines 14 and electronically conductive polymer 16.

While any of the electronically conductive polymers and metal grids described above can be used in these articles, some particularly useful articles have receiver substrates on which is disposed a continuous electronically conductive polymer that comprises a substituted or unsubstituted thiophene-containing polymer, and a metal grid comprising two or more metal lines that comprise at least one metal selected from the group consisting of silver, gold, copper, platinum, palladium, tin, indium, aluminum, and mixtures thereof. A plurality of silver lines is particularly useful.

In some of these embodiments, the electronically conductive polymer comprises a substituted or unsubstituted thiophene-containing polymer and the metal grid consists essentially of a plurality of silver lines.

In general, the receiver substrate can be prepared from any of the materials described above for the donor substrate. However, the donor substrate and receiver substrate can comprise the same or different materials, and they can have the same or different transparency, thickness, and other physical or chemical properties. For many applications and uses, the receiver substrate is transparent (as defined above for the donor substrate) and comprises a flexible polymer or flexible glass. Flexible polymer film can be composed of one or more polyesters, polycarbonates, polyolefins, polystyrenes, polyamides, polyurethanes, and mixtures thereof. Flexible glasses are generally composed of alkali-free borosilicate glass as described for example at http://www.globalcommhost.com/corning/CDTContent/assets/Corning_FlexibleG lass_FactSheet.pdf. Further descriptions of flexible glass and methods for its manufacture are provided in U.S. Pat. No. 7,677,058 (Hawtof et al.) and references therein, that is incorporated herein by reference. The receiver substrate can also be composed of metals or metal-polymer laminates, polymer-paper laminates, including but not limited to, anodized aluminum, indium tin oxide-coated polymeric films, various glasses including flexible glass, indium tin oxide-coated glass, flexible circuitry, circuit boards, silicon or other semiconductors, ceramics, and a variety of different types of papers (including filled or unfilled, calendered, or coated papers), textiles, or woven or non-woven polymers.

The article of this invention can comprise an adhesive located between the receiver substrate and the composite of metal grid and electronically conductive polymer. This adhesive can be arranged in a continuous layer to completely cover the receiver substrate, or it can be applied in a predetermined or random pattern so that only portions of the receiver substrate are covered. Useful adhesives include those described above for the laminate donor element and include for example, an epoxy, acrylate polymer, vinyl polymers, polyurethane, polyester, polyimine, polyolefin, polycarbonate, polystyrene, polysiloxane, or a mixture thereof. However, it is not necessarily desired that the adhesive used in the receiver sheet have the same release properties that an adhesive used in the laminate donor element has. In many embodiments, the same type of adhesive can be used in both the laminate donor element and receiver sheet. The electronically conductive polymer layer can be disposed between the metal grid and the adhesive layer.

During the transfer of the composite of metal grid and electronically conductive polymer from the laminate donor element to an article such as a receiver sheet, the laminate donor sheet and receiver sheet comprising the receiver substrate are brought into intimate contact (as illustrated in FIGS. 7 and 7a). Unless otherwise indicated, the term "intimate contact" refers to essentially complete physical contact of the laminate donor element and receiver sheet, but it also refers to the two elements being in proximity so that there is an air gap of less than 10 µm so that transfer is still possible.

The resulting assembly then comprises the laminate donor element in intimate contact with a receiver sheet so that the metal grid is in contact with the receiver sheet (or an adhesive layer disposed between the donor substrate and the receiver substrate) and the electronically conductive polymer of the donor laminate element fills in the voids among the metal grid lines and thus also come into contact with the receiver sheet (or an adhesive layer disposed between the donor substrate and the receiver substrate). In other words, the electronically conductive polymer that is generally in the form of a layer in the voids is in intimate contact with the receiver sheet (or adhesive layer disposed between the donor substrate and the receiver substrate).

In some embodiments of the assembly, the electronically conductive polymer layer comprises one or more members of the group consisting of substituted or unsubstituted pyrrole-containing polymers, substituted or unsubstituted thiophene-containing polymers, and substituted or unsubstituted aniline-containing polymers, and the metal grid comprises a plurality of metal lines comprising at least one metal selected from the group consisting of silver, gold, copper, platinum, palladium, tin, indium, aluminum, and mixtures thereof.

In further useful embodiments, the electronically conductive polymer layer comprises a substituted or unsubstituted thiophene-containing polymer, and the metal grid consists essentially of a plurality of silver lines, wherein the metal grid covers at least 0.01% and up to and including 90% of the donor substrate surface area, each silver line of the metal grid has an average width of at least 0.01 µm and up to and including 500 µm and an average height of at least 0.01 µm and up to and including 10 µm, the electronically conductive polymer has an average thickness of at least 0.01 µm and up to and including 10 µm, and the composite of the metal grid and electronically conductive polymer layer exhibits a peel force of less than or equal to 40 g/cm for separation from the donor substrate at room temperature.

In the noted assembly, both the donor substrate and the receiver substrate can be transparent and composed of the same or different flexible polymer or flexible glass.

Method of Forming Elements and Articles

The laminate donor elements used in this invention can be prepared using various techniques. In a particularly useful embodiment, the laminate donor element can be formed in the following way:

A particularly useful donor substrate is an extruded and biaxially (3.3×3.3) stretched PET web such as the Estar product produced by Eastman Kodak Company, for example 125 µm in thickness. The donor substrate can be uncoated on both sides (that is, no primer or subbing layers).

A metal grid can be applied after the donor substrate is treated with corona discharge using flexographic printing in a grid pattern using an ink comprising a nanoparticulate metal (such as nanoparticulate silver). The resulting printed web is dried for example using infrared radiation.

The electronically conductive polymer is subsequently coated, for example by hopper or by gravure, onto the metal grid in a composition comprising a conductive polymer such as polyethylene dioxythiophene polystyrenesulfonic acid, and then dried.

In a particularly useful embodiment, a receiver sheet can comprise a receiver substrate that is the same or different material as used in the laminate donor element. It is particularly useful if the donor substrate and receiver substrate (or article substrate) are the same or similar materials.

A particularly useful adhesive is an acrylate-based optically clear material that can be disposed either onto the receiver substrate or over the composite of metal grid and the electronically conductive polymer that is disposed on the donor substrate. Alternatively, the adhesive can be disposed as a separate pattern or layer between the receiver substrate and the donor substrate while creating an assembly described herein. It is particularly useful that the adhesive, whether as on the receiver sheet or the laminate donor element, or as a separate layer has peelable release layer(s) as described above over it to facilitate easier handling. The release layer is typically removed when creating the assembly.

The articles of this invention upon transfer can be prepared as follows: under heat, pressure, or both heat and pressure, forming an assembly of a laminate donor element and a receiver sheet, as described above. The assembly is formed by bringing the side of the laminate donor element bearing the composite of metal grid and electronically conductive polymer into intimate contact with a suitable receiver sheet, optionally further disposing an adhesive between the laminate donor substrate and the receiver sheet. The composite of metal grid and electronically conductive polymer is then transferred from the donor substrate to the receiver sheet to form the reverse composite described above onto the receiver sheet, such that at least some of the metal grid is left uncovered. The transfer is completed by peeling the donor substrate away from the assembly, that is, away from the reverse composite on the receiver sheet. In some instances, pressure or vacuum can be used to hold the laminate donor element in intimate contact with the receiver sheet.

In some embodiments of this method, the receiver substrate is transparent and comprises a flexible polymer or flexible glass as described above. Moreover, the metal grid can comprise a plurality of silver lines and the electronically conductive polymer can be a substituted or unsubstituted thiophene-containing polymer. As noted above, the composite of metal grid and electronically conductive polymer layer that is used in the practice of this method exhibits a peel force of less than or equal to 40 g/cm for separation from the donor substrate at room temperature.

The laminate donor element can be heated by application of direct heat on a selected portion or over its entire surface area in the assembly. Heat can be generated using a heating element (for example, a thermal resistive print head), a source of converting radiation (such as a beam of visible or infrared radiation) to heat, or application of an electrical current to generate heat. In many instances, thermal transfer using radiation from, for example, a lamp or laser, is useful because of the accuracy and precision that can be achieved using this technique. The size and shape of a pattern of the transferred composite of metal grid and electronically conductive polymer can be controlled for example by selecting the size of the radiation beam, the exposure pattern of the radiation beam, the duration of the directed radiation contact with the laminate donor element, and the given materials in the laminate donor element and receiver sheet. The term "pattern" is meant to refer to a defined arrangement of lines and shapes, for example, lines, circles, squares, or other shapes). Transfer can be carried out using a source of transferring radiation as noted above, such as UV, visible, near-infrared, or infrared radiation.

Suitable lasers for effecting transfer can include, for example, high power (>100 mW) single mode laser diodes, fiber-coupled laser diodes, and diode-pumped solid state lasers (for example, Nd:YAG and Nd:YLF). Laser exposure dwell times can be in the range of at least 0.1 microseconds and up to and including 100 microseconds and laser fluences can be at least 0.01 J/cm$^2$ and up to and including 1 J/cm$^2$.

When high spot placement accuracy is required (for example, for high information full color display applications) over large donor substrate areas, a laser is particularly useful as the radiation source. Laser sources are compatible with both large rigid donor substrates such as 1 m×1 m×1.1 mm glass, and continuous or sheeted donor substrates, such as 100 μm polyimide sheets.

In some embodiments, as the laminate donor element is brought into intimate contact with a receiver sheet, a laser source can be then used in an imagewise fashion (for example, digitally or by analog exposure through a mask) to perform imagewise transfer of materials from the laminate donor element to the receiver sheet according to any desired pattern. In operation, a laser can be rastered or otherwise moved relative to the laminate donor element and the receiver sheet, the laser being selectively operated to illuminate portions of the laminate donor element according to a desired pattern. Alternatively, the laser can be stationary and the assembly of laminate donor element and receiver sheet is moved relative to the laser.

The present invention does not require a separate light-to-heat conversion layer in the laminate donor element. Such a layer typically reduces light transmission and is desirable for some applications. Nevertheless, in some applications the light-to-heat layer can be utilized.

As noted above, a heating element, such as a resistive heating element, can be used to affect the transfer. Resistive thermal print heads or arrays can be particularly useful with smaller donor substrate sizes (for example, less than approximately 30 cm in any dimension) or for larger patterns, such as those required for alphanumeric segmented displays.

Pressure can be applied during the transferring operation using either a mechanically or acoustically generated force. Mechanical force can be generated by a variety of means well known in the art, for example, by contacting the laminate donor element and receiver sheet between opposing nip rollers. The nip rollers can be smooth or one or both rollers can have an embossed pattern. Alternatively, the mechanical force can be generated by the action of a stylus upon either the laminate donor element or receiver sheet when they are in intimate contact in the assembly. The laminate donor element and receiver sheet can be brought into intimate contact in a stamping press using either smooth or patterned platens. Another means of applying mechanical force includes the use of acoustic force that can be generated using a device similar to that disclosed in U.S. Patent Application Publication 2001/0018851 (Horine) wherein a transducer passes acoustic energy through an acoustic lens which in turn focuses its received acoustic energy into a small focal area of the laminate donor element when it is in intimate contact with the receiver sheet.

Peel force for separation of the donor substrate from the reverse composite of metal grid and electronically conductive polymer and receiver sheet is an important consideration as that plays a role in the transfer process. Peel force for the separation is determined using an IMASS SP-2000 Peel Tester. In this testing, the composite of metal grid and electronically conductive polymer on the donor substrate is lightly scored with a razor knife. A two inch (5 cm) wide Permacel tape is then applied using a 5 lb (2.3 kg) roller applied over the razor knife cut composite. Strips of 1 inch×6 inch (2.5 cm×15.2 cm) thus prepared are then subjected to a 180° peel force. The tape is peeled back at 180° with the composite of metal grid and electronically conductive polymer bonded to it, at a peel speed of 12 ft/min (3.6 m/min) using a 5 kilograms load cell in the IMASS SP-2000 Peel Tester. The average peel force, measured in g/inch or g/cm for at least 6 strips, is reported as the peel force for separation of the composite of metal grid and electronically conductive polymer from the donor substrate.

As noted above, an adhesive can be present either on the receiver sheet or over the composite of metal grid and electronically conductive polymer or as a separate layer to facilitate transfer of the composite of metal grid and electronically conductive layer to the receiver sheet.

The laminate donor elements and method for transferring the composite of metal grid and electronically conductive polymer are useful, for example, to reduce or eliminate wet processing steps of processes such as photolithographic patterning that are used to form many electronic and optical devices. In addition, laser thermal transfer can often provide better accuracy and quality control for very small devices, such as small optical and electronic devices, including, for example, transistors and other components of integrated circuits, as well as components for use in a display, such as electroluminescent lamps and control circuitry. Moreover, laser thermal transfer can, at least in some instances, provide for better registration when forming multiple devices over an area that is large compared to the device size. As an example, components of a display, which has many pixels, can be formed using this method.

In some instances, multiple laminate donor elements can be used to form a single device or other object. For example, one laminate donor element can be used to form a gate electrode of a field effect transistor and another laminate donor element can be used to form the gate insulating layer and semiconducting layer, and yet another laminate donor element can be used to form the source and drain contacts. A variety of other combinations of two or more laminate donor elements can be used to form a device, each laminate donor element forming one or more layers of the device.

The receiver sheet can have a receiver substrate as described above for specific uses that include, but not limited to, transparent films, display black matrices, passive and active portions of electronic displays, metals, semiconductors, glass, various papers, ceramics, and polymers.

In some embodiments, the receiver sheet forms at least a portion of a device, such as a display device. The display device typically comprises at least one imageable layer wherein the imageable layer can contain an electrically imageable material. The electrically imageable material can be light emitting or light modulating. Light emitting materials can be inorganic or organic in nature such as organic light emitting diodes (OLED) or polymeric light emitting diodes (PLED). The light modulating material can be reflective or transmissive. Light modulating materials can be electrochemical, electrophoretic, such as Gyricon particles, electrochromic, or liquid crystals. The liquid crystalline material can be twisted nematic (TN), super-twisted nematic (STN), ferroelectric, magnetic, or chiral nematic liquid crystals. Especially preferred are chiral nematic liquid crystals. The chiral nematic liquid crystals can be polymer dispersed liquid crystals (PDLC). Structures having stacked imaging layers or multiple substrate layers, however, are optional for providing additional advantages in some case.

After transferring the composite of metal grid and electronically conductive polymer and any other operational or auxiliary layers, the reverse composite can be incorporated in a device as any one or more conducting electrodes present in such devices.

In other embodiments, an electrically imageable material can be addressed with an electric field and then retain its image after the electric field is removed, a property typically referred to as "bistable". Particularly suitable electrically imageable materials that exhibit "bistability" are electrochemical, electrophoretic, such as Gyricon particles, electrochromic, magnetic, or chiral nematic liquid crystals. Especially useful are chiral nematic liquid crystals. The chiral nematic liquid crystals can be polymer dispersed liquid crystals (PDLC).

In one embodiment, the display device or display sheet has simply a single imaging layer of liquid crystal material along a line perpendicular to the face of the display, such as a single layer coated on a flexible substrate. Such a structure, as compared to vertically stacked imaging layers each between opposing substrates, is especially advantageous for monochrome shelf labels and the like. Structures having stacked imaging layers, however, are optional for providing additional advantages in some case.

Some likely uses of the articles of the present invention are in devices such as touch screens including resistive-type or capacitive type touch screens, RFID tags, EMI shields, PCB, flexible or rigid photovoltaic devices, batteries and other uses described above.

Still other possible uses of the present invention are in devices that are optical elements, such as chiral nematic broadband polarizers, filter arrays, or chiral liquid crystalline retardation films. Among these are active and passive optical elements or color filters and liquid crystal displays, for example STN, TN, AMD-TN, temperature compensation, polymer free or polymer stabilized chiral nematic texture (PFCT, PSCT) displays. Possible display industry applications include ultralight, flexible, and inexpensive displays for notebook and desktop computers, instrument panels, video game machines, videophones, mobile phones, hand-held PCs, PDAs, e-books, camcorders, satellite navigation systems, store and supermarket pricing systems, highway signs, informational displays, smart cards, toys, and other electronic devices.

In some embodiments, the electronic device has a light modulating material that comprises at least one member selected from the group consisting of electrochemical, electrophoretic, electrochromic, and liquid crystal materials.

Another application of the present invention is for the preparation of touch screens that are widely used in conventional CRT's and in flat-panel display devices in computers and in particular with portable computers. The present invention can be used to apply a transparent composite of metal grid and electronically conductive polymer in any of the touch screens known in the art, including but not limited to those disclosed in U.S. Patent Application Publications 2003/0170456 (Anderson et al.) and 2003/0170492 (Anderson et al.), U.S. Pat. No. 5,738,934 (Jones), and WO 00/39835 (Willems et al.).

The present invention provides at least the following embodiments and combinations thereof, but other combinations of features are considered to be within the present invention as a skilled artisan would appreciate from the teaching of this disclosure:

1. An article comprising an article substrate having thereon a continuous electronically conductive polymer and a metal grid disposed within the outer surface of the continuous electronically conductive polymer layer such that the voids of the metal grid are filled by the continuous electronically conductive polymer, and wherein the electronically conductive polymer is also disposed between the substrate and the metal grid.

2. An article comprising an article substrate, having thereon, in order, an adhesive layer and a reverse composite comprising an electronically conductive polymer layer and a metal grid such that the metal grid is disposed over the adhesive layer and the voids of the metal grid are filled by the electronically conductive polymer, and at least some of the metal grid is uncovered.

3. The article of embodiment 2 wherein the adhesive layer comprises an epoxy, acrylate polymer, polyurethane, polyester, polyolefin, polycarbonate, polysiloxane, or a mixture thereof.

4. The article of embodiment 2 or 3 wherein the metal grid is disposed directly on the adhesive layer.

5. The article of any of embodiments 1 to 4 wherein the electronically conductive polymer layer is also disposed between the metal grid and the adhesive layer.

6. The article of any of embodiments 1 to 5 wherein the electronically conductive polymer layer comprises a substituted or unsubstituted thiophene-containing polymer, and the metal grid comprises two or more metal lines comprises at least one metal selected from the group consisting of silver, gold, copper, platinum, palladium, indium, tin, aluminum, and mixtures thereof.

7. The article of any of embodiments 1 to 6 wherein the electronically conductive polymer is a substituted or unsubstituted thiophene-containing polymer and the metal grid consists essentially of a plurality of silver lines.

8. The article of any of embodiments 1 to 7 wherein the article substrate is a transparent and flexible polymer or flexible glass.

9. A method of forming an article of any of embodiments 1 to 8, comprising a metal grid, the method comprising:

under heat, pressure, or both heat and pressure, forming as assembly of a laminate donor element and a receiver sheet, the laminate donor element comprising, in order:
a donor substrate,
a metal grid comprising two or more metal lines that are in direct contact with only portions of the donor substrate, leaving portions of the donor substrate uncovered by the metal grid, and
an electronically conductive polymer layer that directly covers the portions of the donor substrate uncovered by the metal grid, and optionally directly covers at least some of the metal grid, thereby forming a composite of metal grid and electronically conductive polymer, and transferring the composite of metal grid and electronically conductive polymer from the donor substrate to the receiver sheet so that the receiver sheet has thereon a reverse composite comprising the electronically conductive polymer layer and the metal grid such that the metal grid is disposed on the receiver sheet and the voids of the metal grid are filled by the electronically conductive polymer, and at least some of the metal grid is uncovered.

10. The method of embodiment 9 wherein there is an adhesive disposed between the donor substrate and the receiver substrate.

11. The method of embodiment 9 or 10 wherein the composite transferring is carried out using pressure applied by acoustic or mechanical force.

12. The method of embodiment 9 or 10 where the transferring is carried out using a source of radiation.

13. The method of any of embodiments 9 to 12 wherein the receiver sheet comprises a receiver substrate that is a transparent and flexible polymer or flexible glass.

14. The method of any of embodiments 9 to 13 wherein the metal grid comprises a plurality of silver lines and the electronically conductive polymer is a substituted or unsubstituted thiophene-containing polymer.

15. The method of any of embodiments 9 to 14 wherein the composite of metal grid and electronically conductive polymer layer exhibits a peel force of less than or equal to 40 g/cm for separation from the donor substrate at room temperature.

16. The method of any of embodiments 9 to 15 wherein the transferring is carried out by peeling the laminate donor substrate away from the assembly.

17. An assembly comprising a laminate donor element in intimate contact with a receiver sheet comprising a receiver substrate, the laminate donor element comprising, in order:
a donor substrate,
a metal grid comprising two or more metal lines that are in direct contact with only portions of the donor substrate, leaving portions of the donor substrate uncovered by the metal grid, and
an electronically conductive polymer layer that directly covers the portions of the donor substrate uncovered by the metal grid, and optionally directly covers at least some of the metal grid, thereby forming a composite of metal grid and electronically conductive polymer.

18. The assembly of embodiment 17 wherein the electronically conductive polymer layer comprises one or more members of the group consisting of substituted or unsubstituted pyrrole-containing polymers, substituted or unsubstituted thiophene-containing polymers, and substituted or unsubstituted aniline-containing polymers, and the metal grid comprises a plurality of metal lines comprising at least one metal selected from the group consisting of silver, gold, copper, platinum, palladium, tin, indium, aluminum, and mixtures thereof.

19. The assembly of embodiment 17 or 18 wherein the electronically conductive polymer layer comprises a substituted or unsubstituted thiophene-containing polymer, and the metal grid consists essentially of a plurality of silver lines, wherein the metal grid covers at least 0.01% and up to and including 90% of the donor substrate surface area, each silver line of the metal grid has an average width of at least 0.01 µm and up to and including 500 µm and an average height of at least 0.01 µm and up to and including 10 µm, the electronically conductive polymer has an average thickness of at least 0.01 µm and up to and including 10 µm, and the composite of the metal grid and electronically conductive polymer exhibits a peel force of less than or equal to 40 g/cm for separation from the donor substrate at room temperature.

20. The assembly of any of embodiments 17 to 19 wherein both the donor substrate and the receiver substrate are transparent and composed of the same or different flexible polymer or flexible glass.

21. The assembly of any of embodiments 17 to 20 further comprising an adhesive located between the receiver substrate and the donor substrate.

22. The assembly of any of embodiments 17 to 21 further comprising an adhesive located between the receiver substrate and the composite of metal grid and electronically conductive polymer.

The following Examples are provided to illustrate the practice of this invention and to compare the present invention to non-inventive embodiments, and the invention examples are not meant to be limiting in any manner.

Invention Example 1

A laminate donor element of this invention was prepared in the following manner:

A donor substrate was chosen as a 100 micrometer thick uncoated poly(ethylene terephthalate) (PET) film. This donor substrate was treated on one side with corona discharge and flexographically printed with a metal grid having a random pattern of interconnected silver lines using a commercially available nanoparticulate silver ink dispersion (such as one obtained from PChem Associates). This metal grid of silver lines was further coated with the following Formulation A containing an electronically conductive polymer to provide a wet coverage of 32 $cm^3/m^2$. Upon drying, the electronically conductive polymer was located in the voids among the silver lines and directly on the donor substrate.

Formulation A

| Ingredients | Description of ingredients | Formulation A Weight % |
|---|---|---|
| Clevios ™ PH 1000 (as received) | PEDOT:PSS* dispersion (1.3 weight % in water) supplied by Heraeus | 84.9 |
| Silquest ® A 187 (as received) | γ-Glycidoxypropyltrimethoxysilane (100%) supplied by Momentive Performance Materials | 0.4 |
| Olin-10G (as received) | p-Isononylphenoxypoly(glycidol) surfactant (10 weight % in water) supplied by Olin Corporation | 0.5 |
| NeoCryl ® A-1127 (as received) | Acrylic copolymer emulsion (43 weight % in water) supplied by Neoresins | 1.0 |
| Isopropanol | | 9.2 |
| Diethylene glycol | | 4.0 |

The following TABLE I describes the features of the resulting laminate donor element of this invention.

TABLE I

| Laminate Donor Element | Substrate | Composite of Metal Grid and Electronically Conductive Polymer | Element Resistance | % VLT** | Peel Strength# |
|---|---|---|---|---|---|
| D1 | Corona Discharge-treated PET | Random mesh pattern of silver lines and electronically conductive polymer of Formulation A | 10 ohms/sq | 72% | 6 g/cm |

**VLT is % transmittance of visible light
The peel strength was measured as described above A receiver sheet (R1) was prepared as follows. It comprised a 100 μm thick poly(ethylene terephthalate) (PET) substrate that was uncoated on one side and coated on the other side with a 25 μm thick optically clear acrylate adhesive (OCA) and a 75 μm thick release layer (such as one available from Daio Paper) over the OCA. Thus, the receiver sheet had the properties shown below in TABLE II below.

An assembly of a laminate donor element and receiver sheet was prepared and used for transferring the composite of metal grid and electronically conductive polymer.

The release layer on receiver sheet R1 was peeled off and the OCA adhesive layer was exposed on R1. The modified receiver sheet was then brought in contact with laminate donor element D1 with the OCA adhesive layer of modified R1 in intimate contact with the composite of metal grid and electronically conductive polymer on the donor substrate of D1, creating an assembly of the laminate donor element and the receiver sheet.

This assembly was passed through a commercial laminator (Ibico PL260 IC) under heat and pressure. Subsequently, the donor substrate was readily peeled off from the assembly. This completed the transfer of the composite of metal grid and electronically conductive polymer from the laminate donor element to the receiver sheet. The silver lines in the metal grid were then exposed in the resulting article. The resistance and % VLT of the resulting article after transfer were measured and shown in TABLE III below.

TABLE II

| Receiver | Substrate | Adhesive | Release layer | Electronically Conductive Layer | Receiver Resistance | % VLT |
|---|---|---|---|---|---|---|
| R1 | PET | Acrylate OCA | Yes | None | N/A | 91% (without release layer) |

TABLE III

| Article | Substrate | Adhesive | Composite | Article Resistance | % VLT |
|---|---|---|---|---|---|
| Receiver R1 after transfer from D1 | Same as R1 | Same as R1 | Reverse of that in D1 | 13 ohms/sq | 71% |

It is clear apparent that the laminate donor element of this invention was effectively used to transfer the metal grid and electronically conductive polymer to a receiver sheet to provide a conductive and transparent article according to the present invention.

Comparative Examples 1 and 2

Comparative Example 1 was prepared by coating Formulation A (described above) at a wet coverage of 32 cm$^3$/m$^2$ on corona discharge treated PET substrate but without any silver grid.

Comparative Example 2 was created by flexographically printing the same random grid pattern of interconnected silver lines of laminate donor element D1 on to corona discharge treated PET substrate but without any subsequent PEDOT:PSS coating. The corresponding laminate donor element resistance, % VLT, and peel strength of these Comparative Examples 1 and 2 are noted below in TABLE IV.

TABLE IV

| Comparative Examples | Substrate | Conductive Layer | Element Resistance | % VLT | Peel strength |
|---|---|---|---|---|---|
| 1 | Corona discharge treated PET | Coated with Formulation A | 78 ohms/sq | 80% | |
| 2 | Corona discharge treated PET | Flexographically printed silver grid | 10 ohms/sq | 85% | 486 g/cm |

It is clear that when Formulation A (comprising PEDOT:PSS) was used without the silver grid (as in Comparative Example 1) the resulting element had substantially higher resistance compared to the laminate donor element of the present invention having a composite of silver grid and electronically conductive polymer (Invention Example 1 and D1). This illustrates the benefit of using the silver grid in combination with the electronically conductive polymers for improving conductivity according to the present invention.

Moreover, when the flexographically printed silver grid was used without the electronically conductive polymer (as in Comparative Example 2), although the resulting element had low resistance, its peel strength was substantially higher than that of the laminate donor element of Invention Example 1 having the composite of metal grid and electronically conductive polymer. Such high peel strength renders the element of Comparative Example 2 undesirable as a donor for any material transfer, compared to the laminate donor element of the present invention.

The invention has been described in detail with particular reference to certain preferred embodiments thereof, but it will be understood that variations and modifications can be effected within the spirit and scope of the invention.

PARTS LIST

10—donor element
12—donor substrate
14—multiple metal lines
16—conductive polymer
18—adhesive
20—assembly
22—receiver sheet
24—receiver substrate
30—article

The invention claimed is:

1. An article comprising an article substrate, having thereon, in order, an adhesive layer and a composite comprising an electronically conductive polymer layer and a metal grid such that the metal grid is disposed over the adhesive layer and voids of the metal grid are filled by the electronically conductive polymer, and at least some of the metal grid is uncovered by the electronically conductive polymer.

2. The article of claim 1 wherein the adhesive layer comprises an epoxy, acrylate polymer, polyurethane, polyester, polyolefin, polycarbonate, polysiloxane, or a mixture thereof.

3. The article of claim 1 wherein the metal grid is disposed directly on the adhesive layer.

4. The article of claim 1 wherein the electronically conductive polymer layer is also disposed between the metal grid and the adhesive layer.

5. The article of claim 1 wherein the electronically conductive polymer layer comprises a substituted or unsubstituted thiophene-containing polymer, and the metal grid comprises two or more metal lines comprises at least one metal selected from the group consisting of silver, gold, copper, platinum, palladium, indium, tin, aluminum, and mixtures thereof.

6. The article of claim 1 wherein the electronically conductive polymer is a substituted or unsubstituted thiophene-containing polymer and the metal grid consists essentially of a plurality of silver lines.

7. The article of claim 1 wherein the article substrate is a transparent and flexible polymer or flexible glass.

8. An assembly comprising a laminate donor element in intimate contact with a receiver sheet comprising a receiver substrate,
the laminate donor element comprising, in order:
a donor substrate,
a metal grid comprising two or more metal lines that are in direct contact with only portions of the donor substrate, leaving portions of the donor substrate uncovered by the metal grid, and
an electronically conductive polymer layer that directly covers the portions of the donor substrate uncovered by the metal grid, and optionally directly covers at least some of the metal grid, thereby forming a composite of metal grid and electronically conductive polymer.

9. The assembly of claim 8 wherein the electronically conductive polymer layer comprises one or more members of the group consisting of substituted or unsubstituted pyrrole-containing polymers, substituted or unsubstituted thiophene-containing polymers, and substituted or unsubstituted aniline-containing polymers, and the metal grid comprises a plurality of metal lines comprising at least one metal selected from the group consisting of silver, gold, copper, platinum, palladium, tin, indium, aluminum, and mixtures thereof.

10. The assembly of claim 8 wherein the electronically conductive polymer layer comprises a substituted or unsubstituted thiophene-containing polymer, and the metal grid consists essentially of a plurality of silver lines,
wherein the metal grid covers at least 0.01% and up to and including 90% of the donor substrate surface area,
each silver line of the metal grid has an average width of at least 0.01 μm and up to and including 500 μm and an average height of at least 0.01 μm and up to and including 10 μm,
the electronically conductive polymer has an average thickness of at least 0.01 μm and up to and including 10 μm, and
the composite of the metal grid and electronically conductive polymer exhibits a peel force of less than or equal to 40 g/cm for separation from the donor substrate at room temperature.

11. The assembly of claim 8 wherein both the donor substrate and the receiver substrate are transparent and composed of the same or different flexible polymer or flexible glass.

12. The assembly of claim 8 further comprising an adhesive located between the receiver substrate and the donor substrate.

13. The assembly of claim 8 further comprising an adhesive located between the receiver substrate and the composite of metal grid and electronically conductive polymer.

14. An article comprising an article substrate having thereon a continuous electronically conductive polymer and a metal grid disposed within an outer surface of the continuous electronically conductive polymer layer such that voids of the metal grid are filled by the continuous electronically conductive polymer, and wherein the electronically conductive polymer is also disposed between the substrate and the metal grid.

* * * * *